United States Patent [19]

Duppong et al.

[11] Patent Number: 4,649,375
[45] Date of Patent: Mar. 10, 1987

[54] APPARATUS FOR DETECTING POWER LINES

[75] Inventors: Denis E. Duppong; Bernard L. McGrew, both of Cedar Rapids; Ramsay P. Decker, Marion, all of Iowa

[73] Assignee: FMC Corporation, Chicago, Ill.

[21] Appl. No.: 793,394

[22] Filed: Oct. 31, 1985

[51] Int. Cl.⁴ .............................................. G08B 21/00
[52] U.S. Cl. .................................... 340/660; 340/685; 212/151
[58] Field of Search ....................... 340/685, 568, 660; 212/151; 361/179

[56] References Cited

U.S. PATENT DOCUMENTS

| | | |
|---|---|---|
| 2,615,969 | 10/1952 | Albrecht .......................... 340/685 X |
| 3,125,751 | 7/1961 | Winters . |
| 3,168,729 | 2/1965 | Volberg . |
| 3,201,775 | 8/1965 | Pedersen ............................ 340/660 |
| 3,745,549 | 7/1973 | Jepperson et al. . |
| 3,786,468 | 1/1974 | Moffitt . |
| 3,833,898 | 9/1974 | Wilkinson ....................... 340/685 X |
| 4,064,997 | 12/1977 | Holland et al. ................. 340/685 X |

Primary Examiner—James L. Rowland
Assistant Examiner—Brian R. Tumm
Attorney, Agent, or Firm—Lloyd B. Guernsey; H. M. Stanley; R. B. Megley

[57] ABSTRACT

Apparatus for mounting on a crane or other construction equipment for detecting the presence of an electrical power line. A reference pickup coil mounted on an upper machinery works or other portion of the equipment generates a reference signal proportional to the strength of a magnetic field in a work area. Other pickup coils mounted on a crane boom or other portions of the equipment which may extend into closer proximity to power lines develop signals which are compared with the reference signal. When any of these signals exceed the reference signal by a predetermined amount a warning signal is developed. Coils having the proper ratio of core length to diameter and having coil winding which extend along approximately half the core length provide output signals which have a predictable amplitude.

5 Claims, 3 Drawing Figures

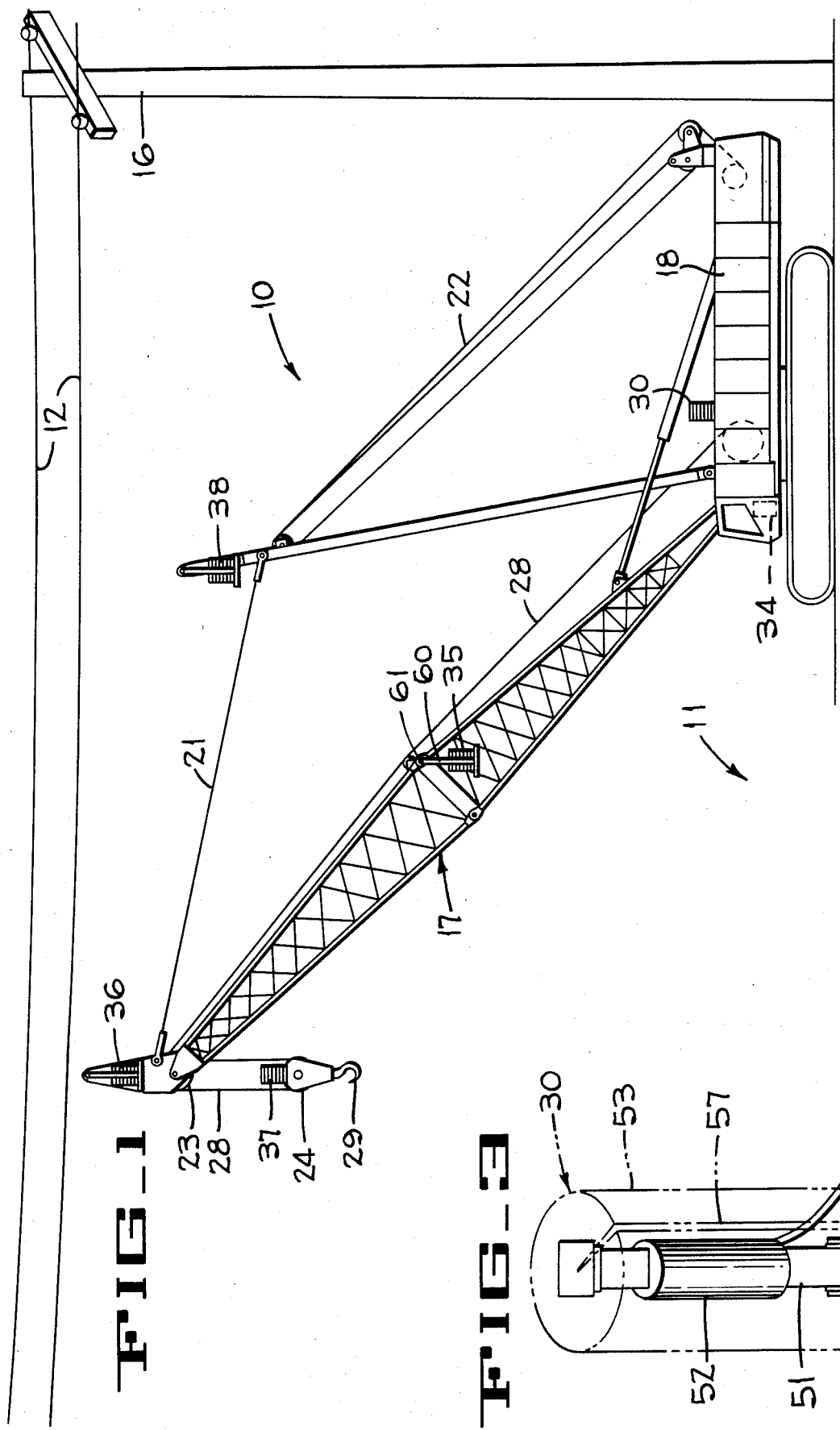

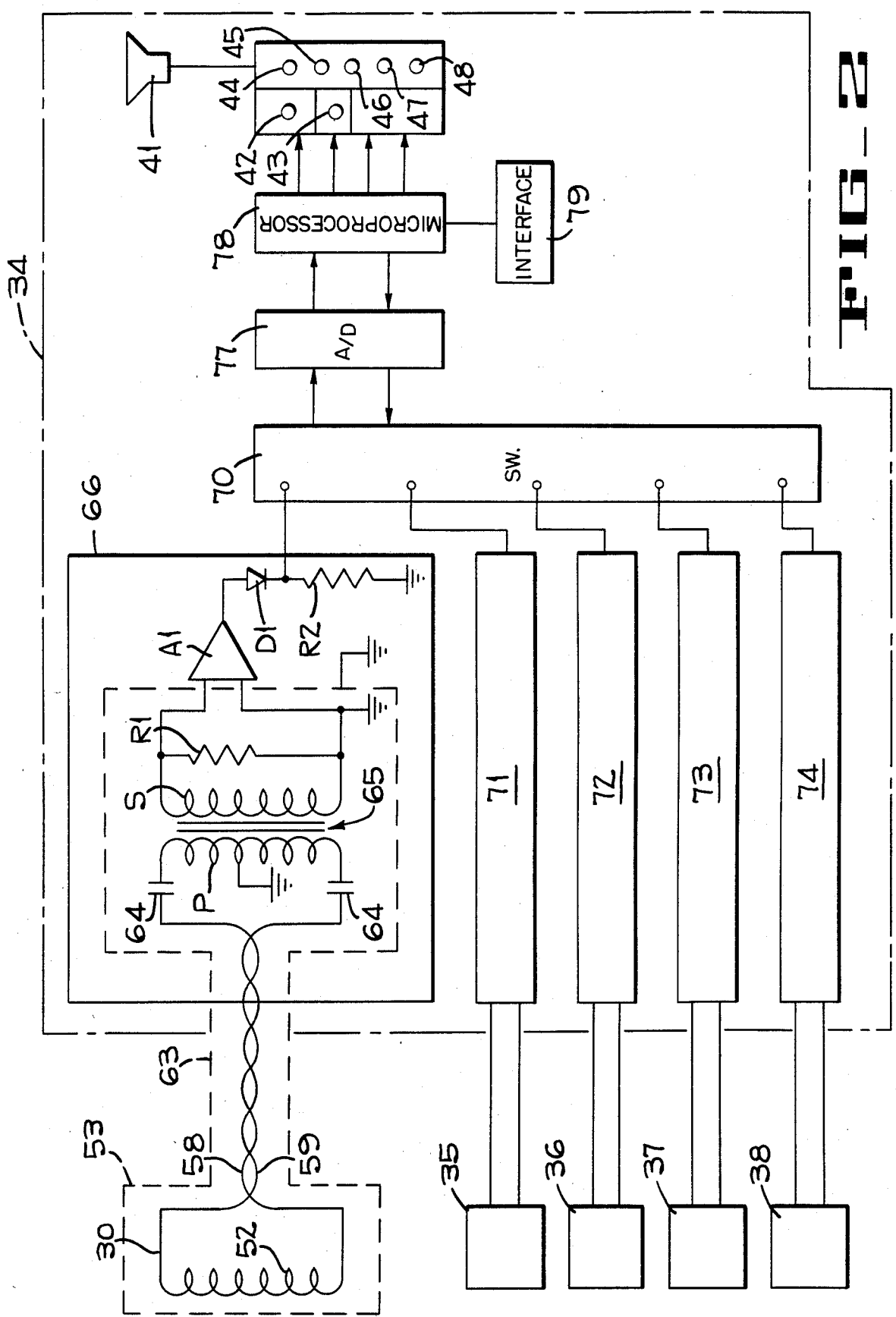
FIG_2

APPARATUS FOR DETECTING POWER LINES

BACKGROUND OF THE INVENTION

1. Field of the Invention

This invention relates to safety apparatus, and more particularly, to a system for warning that a portion of a crane or other construction equipment is near an electrical power line.

2. Description of the Prior Art

In the construction industry it is often necessary to operate cranes and excavators in areas having nearby high voltage power lines which must not be contacted by the crane or the crane boom. In the past, numerous accidents have occurred when the crane boom, the crane lifting lines, or boom support lines and gantry have come into contact with electrical power lines, and operators have been killed by electrocution. As a result industry and government regulators have recommended that a person be stationed on the ground near an operating crane to observe the clearance between the crane and electrical power lines and to give timely warnings of danger for all operations where it is difficult for the operator to monitor the desired clearance by visual means. In practice, it has been found that a ground observer is not a reliable safety element and accidents have occurred when the ground observer was not present or when his attention was diverted.

SUMMARY OF THE INVENTION

The present invention comprises apparatus for warning a construction equipment operator when a portion of the equipment approaches an electrical power line. A reference pickup coil mounted on an upper frame and machinery or other portion of the equipment provides a reference signal representative of the level of field energy in an area where the equipment is being used. A plurality of other pickup coils are mounted on spaced portions of a crane boom and adjacent to a hook at the lower end of a working rope. Output signals from these other pickup coils are each compared with the reference signal and a warning signal is generated when the amplitude of any of these output signals exceeds the amplitude of the reference signal by a predetermined amount. The pickup coils each includes an elongated laminated core having a wire coil wound about a central portion of the core. The ratio of length/diameter of the core and the length of the wire coil is selected to ensure a consistent and stable sensor output with variations in available core permeability.

BRIEF DESCRIPTION OF THE DRAWINGS

FIG. 1. is a diagrammatic perspective view of a construction area with a crane having apparatus for detecting the presence of power lines.

FIG. 2 is a block diagram of a circuit which can be used in the resent invention to provide a warning signal when the crane approaches a power line.

FIG. 3 illustrates details of a pickup coil used in the present invention to develop a signal when the crane approaches a power line.

DESCRIPTION OF THE PREFERRED EMBODIMENT

One type of construction equipment which can utilize the power line detecting apparatus of the present invention is the lattice boom crane 10 shown in FIG. 1. The crane 10 is positioned in a working area 11 adjacent a plurality of electrical power lines 12 mounted on a utility pole 16. A lattice type boom 17 is pivotally attached to an upper machinery works 18 so the boom can be raised and lowered in a working position by a pair of pendant ropes 21 and a pair of boom hoist lines 22. A pair of sheaves 23, 24 and a working rope 28 raise and lower a hook 29 which can be connected for moving a load (not shown).

A reference pickup coil 30 mounted on the upper machinery works 18 provides a reference signal having an amplitude which is determined by the strength of a magnetic field in the general area about the upper machinery works 18. The reference signal is coupled to an electronic comparison system 34 (FIGS. 1, 2) where output signals from a plurality of pickup coils 35–38 are each compared with the reference signal. The amplitude of the output signals from pickup coils 35–38 are determined by the proximity of these pickup coils to the electrical power lines 12. Whenever any of the pickup coils 35–38 moves near an electrical power line 12 the output signal from that pickup coil becomes much greater than the referenced signal from pickup coil 30 causing the comparison system 34 to actuate a horn 41 (FIG. 2) and actuate one or more of a plurality of lights 42–48 that indicates which portion of the equipment is near a power line 12.

The pickup coils 30, 35–38 (FIG. 2) each includes an elongated laminated core 51 (FIG. 3) having a ratio of length/diameter between 8 and 15. A coil 52 is wound about the middle 50 percent of the core because a coil having a relatively short axial length provides flux linking which is substantially uniform over the length of the coil causing calculated values of coil performance parameters to closely match actual values. A larger length/diameter core ratio causes the coil to develop a voltage which is less predictable when the coil is in a changing magnetic field because the flux linkages are less uniform than with a smaller length to diameter core ratio. This nonuniform flux linkages affects the output voltage from the coil. Also mechanical and temperature have a considerable effect on coil permeability when a greater length to diameter ratio is employed, causing the coil output voltage to vary with temperature and with the amount of strain on the core. Also the geomagnetic field may produce larger noise signals in a longer, higher output coil. Each of the pickup coils includes a metallic shield 53 (FIG. 3) surrounding the core 51 and having a longitudinal slot 57 extending half way through the shield. The shield 53 minimizes electrostatic pickup in the coil 52. A pair of twisted wires 58, 59 (FIG. 2) mounted inside a shield 63 (FIGS. 2, 3), connects the output of the coil 52 to the electronic comparison system 34. The shield 63 reduces the amount of induced noise voltage developed in the wires 58, 59.

The pickup coils are vertically mounted (FIG. 1) so the windings in the coil portion 52 (FIG. 2) are generally horizontal to provide maximum coupling to the magnetic field from the power lines 12 (FIG. 1). For example, pickup coil 35 is mounted on a frame 60 which is pivotally connected to the boom 17 by a pin 61. The weight of the pickup coil 35 and frame 60 cause the pickup coil 35 to hang from pin 61 to maintain a vertical orientation.

In the electronic comparison system 34 (FIG. 2) the reference output signal from pickup coil 30 is coupled through a pair of capacitors 64 to a primary winding P of a transformer 65 and to a load-matching resistor R1 in an amplifier-detector 66. The signal from a second winding S of the transformer is amplified by an amplifier A1 and coupled through a diode D1 to a load resistor R2 and a solid state switch 70. Output signals from the pickup coils 35-38 are each coupled through one of a plurality of similar amplifier-detectors 71-74 and applied to the solid state switch 70.

The amplified coil signals from amplifier-detectors 66, 71-74 (FIG. 2) are sequentially coupled through an analog-to-digital converter 77 and applied to a microprocessor 78. The signal from pickup coil 30 is amplified by amplifier-detector 66, is periodically sampled and stored in the microprocessor 78. The signals from pickup coils 35-38 are each amplified by one of the amplifier-detectors 71-74. The output signals from amplifier-detectors are sequentially sampled and compared with the reference signal from amplifier-detector 66. When the amplitude of any of the output signals exceeds the amplitude of the reference signal by a predetermined amount the microprocessor 78 provides a warning signal which actuates a horn 41 and actuates one or more of the warning light 45-48. Lights 45-48 indicate which of the pickup coils 35-38 is generating a large output signal because of a large alternating magnetic field. The microprocessor 78 also provides an alert signal which actuates an alert light 42 when the output signal from any one or more of the pickup coils 35-38 (FIGS. 1, 2) is greater than the reference output signal from pickup coil 30. When an output signal increases by a predetermined amount over the reference signal, the microprocessor 78 actuates a warning light 43. An operator interface 79 allows a human operator to load instructions and data into the microprocessor 78.

The apparatus of the present invention compares the voltage developed in a plurality of pickup coils with the voltage developed in a reference coil to determine that one or more of the pickup coils is approaching an electrical power line. These pickup coils are mounted at spaced intervals on construction equipment which may operate near electrical power lines. Special construction in the coils prevent temperature and strain on the coils from affecting the signals developed by the pickup coils.

Although the best mode contemplated for carrying out the present invention has been herein shown and described, it will be apparent that modification and variation may be made without departing from what is regarded to be the subject matter of the invention.

What is claimed is:

1. Apparatus for detecting electrical power lines, for use with a crane having a boom mounted on an upper machinery works, said apparatus comprising:
   a plurality of pickup coils for intercepting a magnetic field from said power lines;
   means for mounting a first one of said pickup coils on said upper machinery works to provide a reference output signal representative of the strength of a magnetic field in an area about the upper machinery works;
   means for mounting the remainder of said pickup coils on spaced portions of said boom to provide output signals from said remaining pickup coils when said remaining pickup coils approach a power line;
   means for comparing said output signals from each of said remaining pickup coils with said output signal from said first pickup coil to determine when one of said remaining pickup coils is moved near a power line; and
   means for providing a warning signal when an output signal from one of said remaining pickup coils exceeds said reference output signal by a predetermined value.

2. Apparatus for detecting power lines as defined in claim 1 wherein said pickup coils each includes an elongated ferromagnetic core, said core having a ratio of length to diameter of between 8 and 15.

3. Apparatus for detecting power lines as defined in claim 1 wherein said pickup coils each includes an elongated ferromagnetic core having a ratio of length to diameter of between 8 and 15, and a coil winding extending along the central half of said core.

4. Apparatus for detecting power lines as defined in claim 1 wherein said means for comparing includes a microprocessor which periodically samples said reference signal from said first pickup coil and compares the amplitude of each of said output signals from said remaining pickup coils with the amplitude of said reference signal.

5. Apparatus for detecting power lines as defined in claim 1 wherein said means for mounting said pickup coils includes a means for mounting said pickup coils in a generally vertical position so windings in a coil portion are generally horizontal to provide optimal coupling of said magnetic field by said windings.

* * * * *